United States Patent [19]

Wolf et al.

[11] Patent Number: 5,734,561
[45] Date of Patent: Mar. 31, 1998

[54] ASSEMBLY RACK WITH ELECTROMAGNETIC INTERFERENCE SHIELDING

[75] Inventors: Roland Wolf, Hersbruck; Peter Schimpl, Büttenheim; Reinhold Seitz, Hilpoltstein, all of Germany

[73] Assignee: Lucent Technologies Inc., Murray Hill, N.J.

[21] Appl. No.: 326,438

[22] Filed: Oct. 20, 1994

[30] Foreign Application Priority Data

Oct. 22, 1993 [DE] Germany .................. 43 36 071.8

[51] Int. Cl.$^6$ ................................................ H05K 7/14
[52] U.S. Cl. .......................... 361/800; 361/752; 361/759; 361/796; 361/801; 439/377; 174/35 R
[58] Field of Search ........................ 361/754, 758, 361/759, 796, 797, 798, 799, 800, 801, 802, 816, 818, 741, 752, 756; 174/17 R, 35 R, 35 GC; 439/108, 109, 154–159, 374, 377; 220/359

[56] References Cited

U.S. PATENT DOCUMENTS 4,894,753   1/1990   Wadell et al. ........................ 361/424

FOREIGN PATENT DOCUMENTS 4120873   12/1992   Germany .
2065378    6/1981   United Kingdom ............... 361/802

*Primary Examiner*—Gerald P. Tolin
*Assistant Examiner*—Phuong T. Vu

[57] ABSTRACT

The invention relates to an assembly rack with two side walls (10, 11) and with honeycomb plates (20) which are arranged between the side walls and connected to transverse profiled rails (15, 16). In such an assembly rack, a reliable shielding against electromagnetic interference should be safeguarded at low cost. This achieved according to the invention in that two transverse profiled rails (15, 16) together with one honeycomb plate and with two lateral profiled rails form an EMI-shielded, self-contained sub-assembly which can be previously assembled, and in that the assembly rack comprises at least two such sub-assemblies (12, 13) which are connected to the side walls with fastening elements in an EMI-shielded manner.

8 Claims, 7 Drawing Sheets

ASSEMBLY RACK WITH ELECTROMAGNETIC INTERFERENCE SHIELDING

BACKGROUND OF THE INVENTION (1) Field of the Invention

The invention relates to an assembly rack with two side walls and with honeycomb plates arranged between the side walls and connected to transverse profiled rails.

(2) Description of the Related Art

Known assembly racks of this kind usually consist of two side walls which are fixedly interconnected by a series of transverse profiled rails. The simplest form of such an assembly rack comprises two side walls and two front and two rear transverse profiled rails. One front and one rear profiled rail are interconnected each time by guide rails which run parallel to the side walls and which serve to accommodate functional units, for example printed circuit boards, which can be inserted parallel to the side walls. Such a construction is disclosed, for example, in DE-PS 41 20 873. The guide rails therein are provided at their relevant upper sides with guide grooves for holding said printed circuit boards. The guide rails are inserted into openings in the transverse profiled rails with projections and locked to the transverse profiled rails by means of resilient tongues.

It is known to fasten so-called honeycomb plates, which serve to shield against electromagnetic interference, to such transverse rails afterwards. This fastening takes place in known manner in that the honeycomb plates are held in a U-shaped frame which in its turn is provided with a metal shielding cord at its outside. This frame is fastened in known manner to the transverse rails connected to the side walls by special fastening means. The honeycomb plate then lies more or less loosely in the U-shaped groove, while the electromagnetic interference shielding between the frame and the transverse profiled rails takes place by means of the cord-shaped shield which has an excess dimension and which is compressed during screwing together of the frame and the transverse profiled rails. This construction requires a considerable amount of material and labour.

To improve the shielding action between such an U-shaped frame and the honeycomb plate held by the frame, it is further known to construct the frame from two angled parts which are screwed together after the honeycomb plate has been inserted. This construction also requires a considerable amount of material and labour.

Furthermore, a U-shaped rail with a rotary movable limb is known, the mutually opposed limbs each having a projection. For mounting, the honeycomb plate is passed into the groove with the limb in open position and then secured in the groove by pressing down of the movable limb. The projections which are directly opposite one another then bury themselves in the honeycomb plate. Apart from a high cost because of the movable arrangement of the one limb, there is the disadvantage here that the honeycomb plate is held loosely in the notch formed by the projection, so that shielding against electromagnetic interference is no longer guaranteed.

SUMMARY OF THE INVENTION

The invention has for its object to provide an assembly rack of the kind mentioned in the opening paragraph which guarantees a reliable shielding against electromagnetic interference at low cost.

According to the invention, this object is achieved in an assembly rack of the kind mentioned in the opening paragraph in that two transverse profiled rails with one honeycomb plate and with two lateral profiled rails form a self-contained sub-assembly (platform) which is shielded against electromagnetic interference and which can be pre-assembled.

This construction has the advantage that the assembly of a basic framework, which consists of two side walls and several transverse rails according to the present art, is no longer necessary. Instead, the two side walls are directly interconnected by at least two platforms which form self-contained sub-assemblies protected against electromagnetic interference and which are in their turn connected to the side walls in a manner protected against electromagnetic interference. It is no longer necessary, accordingly, first to interconnect the side walls by transverse rails into a basic framework, as is usual in the present art, and subsequently to mount a honeycomb plate held in a frame in a separate process step. Two such platforms according to the invention form between them a space for the accommodation of insertable functional units, for example printed circuit boards. For this purpose, said sub-assemblies may be directly provided with guide rails for accommodating such printed circuit boards.

The interference-proof shielding of the sub-assemblies against the side walls preferably takes place in an embodiment of the invention by means of resilient, so-called EMI shielding elements which press themselves resiliently against the side walls during mounting of the sub-assemblies and thus achieve a reliable electromagnetic shielding. The term EMI (electromagnetic interference) is used hereinafter in connection with shielding against electromagnetic or electrostatic fields. The expression "EMI-proof" means that a shielding against electromagnetic or electrostatic fields is provided.

An embodiment of the invention is characterized in that the side walls in the four fastening regions of a platform are provided with inward-directed horizontal bosses for supporting a platform, with inward-directed vertical bosses for engaging vertical grooves of the platform, and with bores for accommodating fastening screws for the platform. Said bosses and bores are preferably arranged in the regions of the corner edges of a platform so as to obtain the greatest possible stability.

An embodiment of the invention is then characterized in that the corner edges of the transverse profiled rails each have at least one semicircular groove which extends at right angles to the plane of the platform for engaging the inward-directed vertical bosses provided in the side walls. The vertical arrangement of the bosses and of the semicircular grooves provides the inserted platform with a reliable protection against rotation.

A simple connection of the side walls to the platforms is preferably achieved in that the transverse profiled rails each have a first longitudinal channel for the accommodation of fastening screws for the side walls which can be screwed in a longitudinal direction for the side walls.

To guarantee that the platforms constructed as independent sub-assemblies lie EMI-shielded against the side walls also in the assembled state, an embodiment of the invention is characterized in that the lateral profiled rails are each provided with EMI-shielded resilient elements at their sides which face the side walls. It is safeguarded thereby that the rifts between the side walls and the platforms are reliably shielded against electromagnetic radiation.

A further embodiment of the invention is characterized in that the transverse profiled rails of two platforms lying one above the other are each provided with guide rails for accommodating functional units which are insertable parallel to the side walls. For this purpose, for example, one of the limbs of each of the U-shaped transverse profiled rails is prolonged and provided with bores for receiving the guide rails. This construction renders a simple mounting of the guide rails possible.

For fastening of, for example, a front screen or a rear wall printed circuit board in a simple manner, a further embodiment of the invention is characterized in that the transverse profiled rails each comprise a second longitudinal channel which is open towards the front or rear of the assembly rack and which serves to accommodate fastening screws which can be inserted transversely to the longitudinal direction of the channel.

In a further embodiment of the invention, the transverse profiled rails may each comprise a third longitudinal channel for accommodating a threaded rail to which further components can be fastened in a simple manner by means of fastening screws.

In a further embodiment of the invention, the space defined by two platforms for the accommodation of insertable functional units or sub-assemblies can be closed by a front screen which can be suspended from the upper transverse profiled rail, which screen has a circumferential resilient EMI shield and can be brought into a lockable closed position through compression of said resilient shield. For closing the opening formed by the platforms, it is sufficient accordingly to suspend the front screen at its upper side and to bring it in the closed position with the use of the force of gravity. A slight pressure against the front screen is sufficient to overcome the resilient force.

In this construction, preferably, the upper transverse profiled rail and the front screen are so profiled in the suspension region that the front screen after being suspended is retained in the closing process itself. Taking out or dropping out of the front door is practically impossible then.

Preferably, the upper and lower transverse profiled rails are each provided with contact surfaces for contact springs of the front screen.

Preferably, the continuous circumferential shielding of the front screen is formed by resilient elements which are provided in the two horizontal edge regions directly against the inside of the front screen and in the two vertical edge regions against the outsides of perpendicularly angled flanges. The shielding action in the horizontal regions follows through contact with mating shielding surfaces of the two transverse profiled rails, and in the vertical regions through contact with the side walls of the assembly rack.

Preferably, lateral locking elements are provided by means of which the front screen can be locked in its closed position.

A further embodiment of the invention is characterized in that
- the transverse and lateral profiled rails are shaped into a frame with an inner circumferential U-shaped groove for retaining the honeycomb plate by means of corner connectors,
- the front and rear transverse profiled rails, whose limbs are directed towards one another, are each provided on the inside with projections which enter the honeycomb plate and which are arranged so as to be mutually offset, and
- the lateral profiled rails are pressed with their groove bottoms against the cut-open edges of the honeycomb plate.

The transverse and lateral profiled rails may be quickly and simply interconnected by means of the corner connectors. The honeycomb plate then lies on all sides in the grooves of the transverse profiled rails on the one hand and in the grooves of the lateral profiled rails on the other hand. The projections provided at the insides of the groove limbs of the transverse profiled rails serve to achieve an EMI shielding between the honeycomb plate and the transverse profiled rails. Owing to the offset of the projections, the honeycomb plate is tensioned between the profiled rails, as will be explained further below, so that a reliable EMI shielding is guaranteed. In the regions of the lateral profiled rails, the groove serves in the first place for guiding the honeycomb plate, while the EMI shielding is achieved in that the resiliently clamped honeycomb plate is pressed into the relevant groove of the side profiled rails with its honeycomb edges formed by cutting-off.

In this situation, the interspacing between the mutually facing, mutually offset projections measured parallel to the limbs of a transverse profiled rail is somewhat smaller than the thickness of the honeycomb plate to be gripped by the two limbs of the transverse profiled rail. It is achieved thereby that the projections can reliably grip into the honeycomb plate during mounting.

A favourable embodiment of the invention consists in that the groove designed for accommodating the honeycomb plate and formed by the limbs of a transverse profiled rail is so formed at its base as to constitute a groove channel for accommodating the corner connectors. A simple mounting of the corner connector together with the honeycomb plate results therefrom.

The invention also relates to a transverse profiled rail for accommodating a honeycomb plate, which rail is characterized in that a) it comprises a longitudinal groove which is U-shaped in cross-section and comprises limbs which run mutually parallel, b) the two limbs each have an inward directed projection, which projections are mutually offset, and c) the interspacing between the two projections—measured as a distance between the two planes which contain the relevant ends of the projections and extend parallel to the limbs—is somewhat smaller than the thickness of a honeycomb plate to be inserted into the groove.

If a honeycomb plate is to be inserted into the groove of such a transverse profiled rail, this will only be possible when the honeycomb plate is inserted obliquely to the limb planes of the transverse profiled rail, since the thickness of the honeycomb plate is greater than the interspacing between the two projections. After its insertion up to the abutment, accordingly, the honeycomb plate lies obliquely in the groove. This fact is utilized for holding the honeycomb plate with tension in two mutually opposed transverse profiled rails with projections of this kind.

Method of manufacturing a platform, which consists of a honeycomb plate held in a frame, takes place in accordance with the following characteristics:

a) the honeycomb plate is inserted obliquely into a groove opening formed by the offset projections of a transverse profiled rail on two mutually opposed sides so that the planes of the limbs are at an angle to the surface of the honeycomb plate, b) the two profiled rails are so far rotated under simultaneous penetration of the projections into the honeycomb plate and tensioning of the honeycomb plate until the limb planes run parallel to the surfaces of the honeycomb plate, c) the side profiled rails provided with rectangular corner connectors are pressed against the free sides of the sharp-edged resilient honeycomb plate, whereby the free ends of the corner connectors enter groove channels of the transverse profiled rails and the U-shaped lateral profiled rails come to lie against the cut-open profiles of the honeycomb plate in an EMI-shielded manner and grip around the honeycomb plate so as to guide the latter.

BRIEF DESCRIPTION OF THE DRAWING

In the drawing, FIGS. 1 to 12 diagrammatically show embodiments of the object of the invention.

DESCRIPTION OF THE PREFERRED EMBODIMENTS

Figure 1:
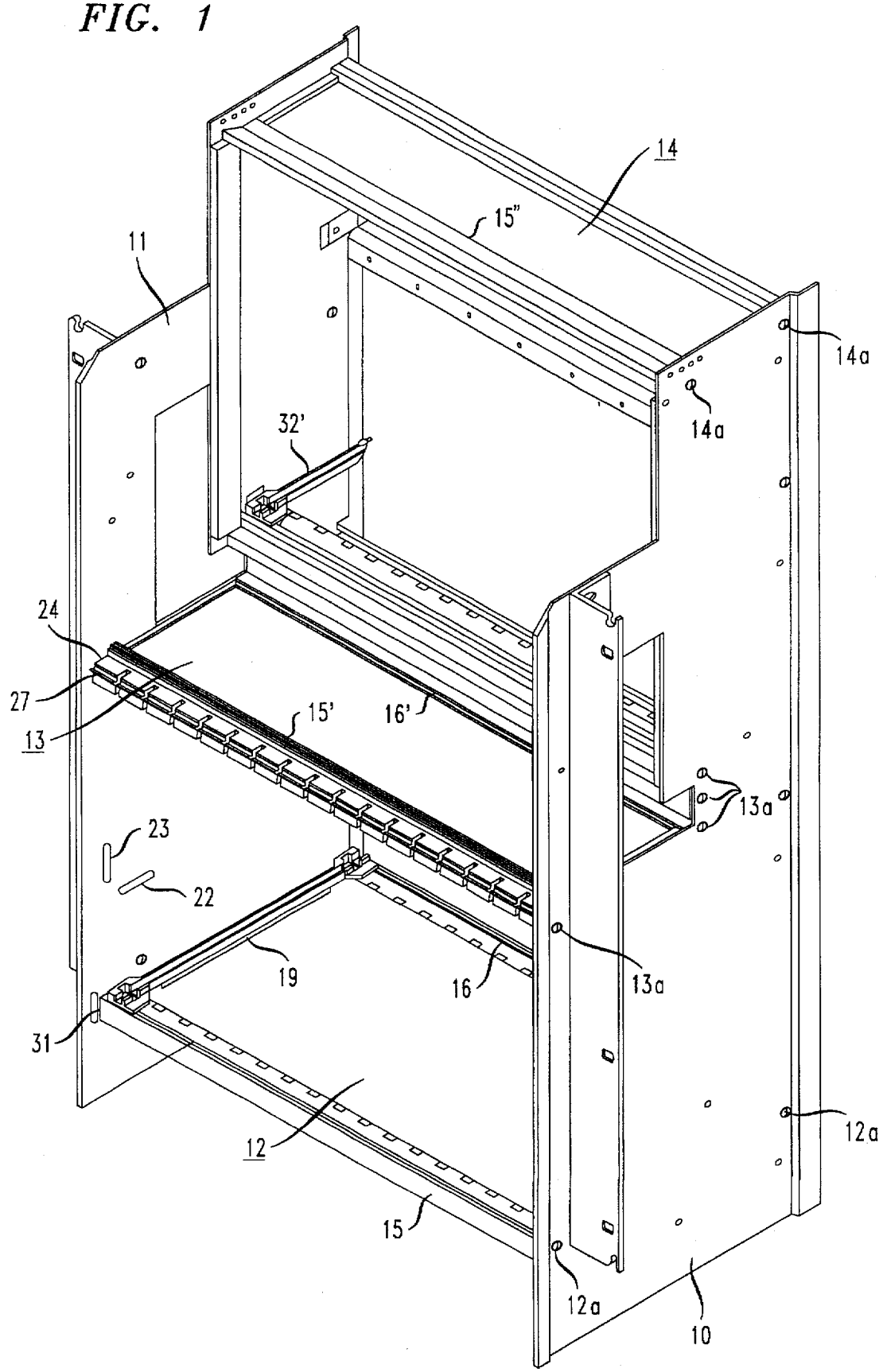
FIG. 1 is a perspective view of an assembly rack with three built-in independent sub-assemblies (platforms), FIG. 2. is a perspective view of the bottom platform on an enlarged scale.

The assembly rack of FIG. 1 comprises two side walls 10 and 11 which are interconnected by three platforms 12, 13, 14 formed by self-contained sub-assemblies. Screws 12a, 13a, 14a serve to fasten the platforms 12 to 14 to the side walls 10 and 11.

Figure 2:
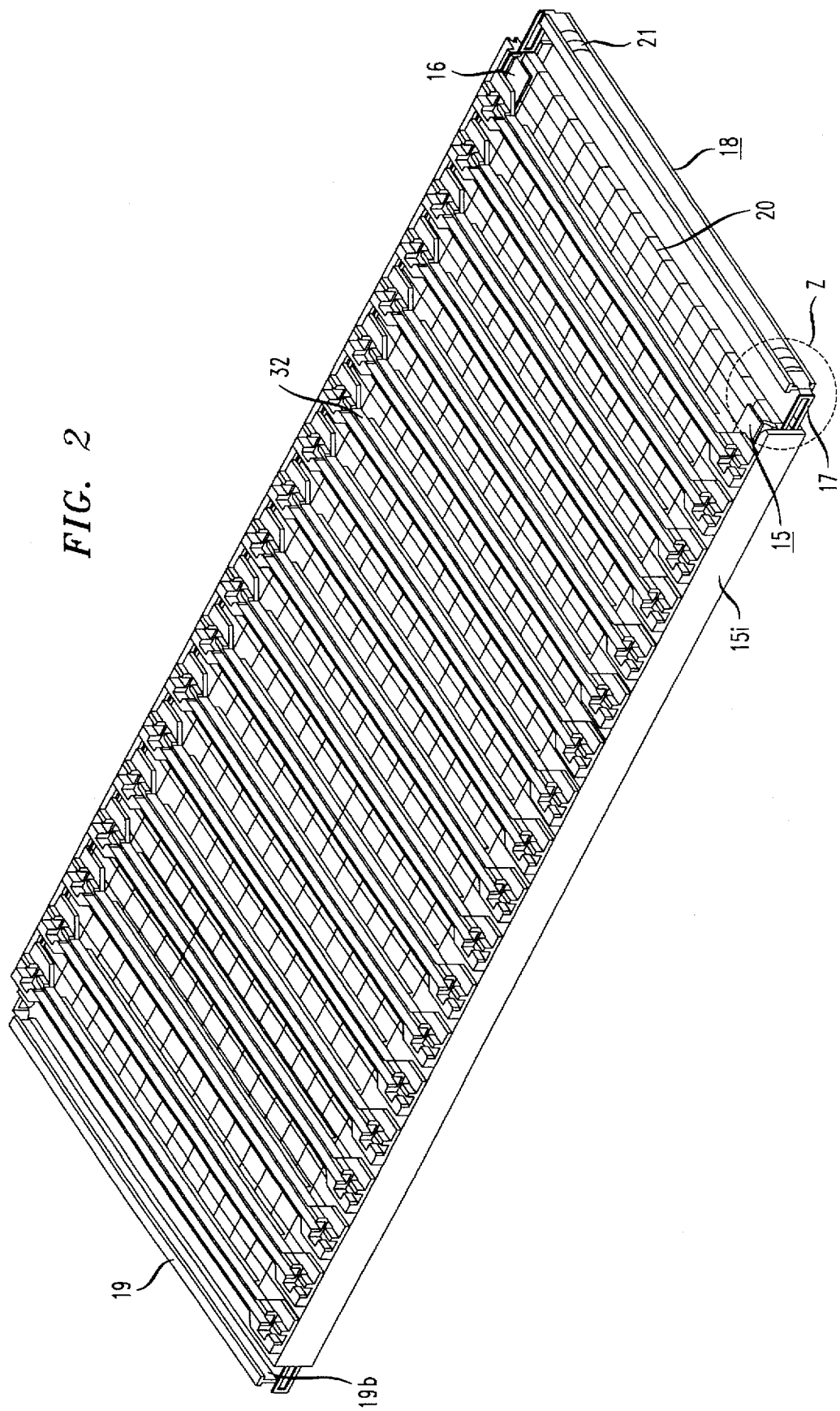
Figure 3:
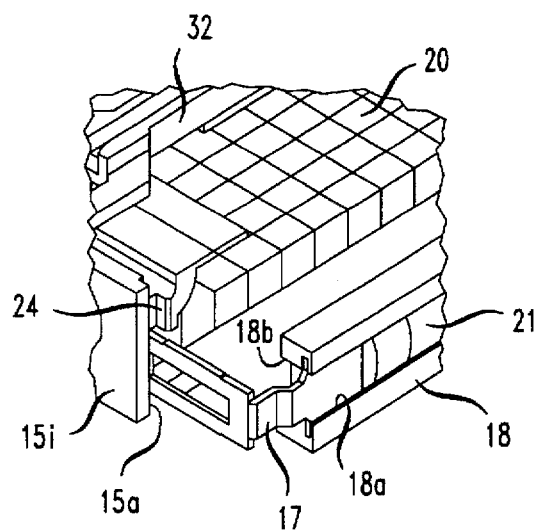
FIG. 3 shows a detail Z from FIG. 2 on an enlarged scale.

Each platform is built up from the same components, i.e. from two transverse profiled rails, two lateral profiled rails, four corner connectors, and a honeycomb plate. FIG. 2 shows the bottom platform 12 with two transverse profiled rails 15, 16 which are joined together into a framework with lateral profiled rails 18, 19 by means of corner connectors 17, this framework serving to retain a honeycomb plate 20. The honeycomb plate 20 is to shield against electromagnetic fields while at the same time ensuring a good ventilation. The corner connectors 17 are inserted at one side in grooves 18a of the lateral profiled rails and at the other side in grooves 15a, 16a of the corresponding transverse profiled rails. Metal spring elements 21 are also inserted into the grooves 18a, pressing against the side walls 10, 11 in the assembled state of the platforms 12 to 14, thus ensuring a reliable EMI-shielding.

Figure 4:
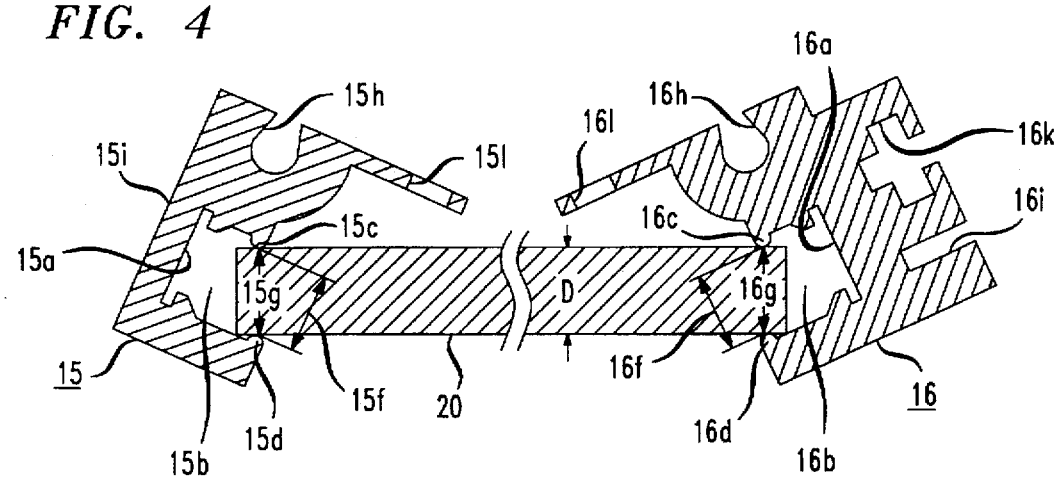
FIGS. 4 and 5 are enlarged cross-sections through two transverse profiled rails with inserted honeycomb plates in an assembly phase and in a finished mounted state.
Figure 5:
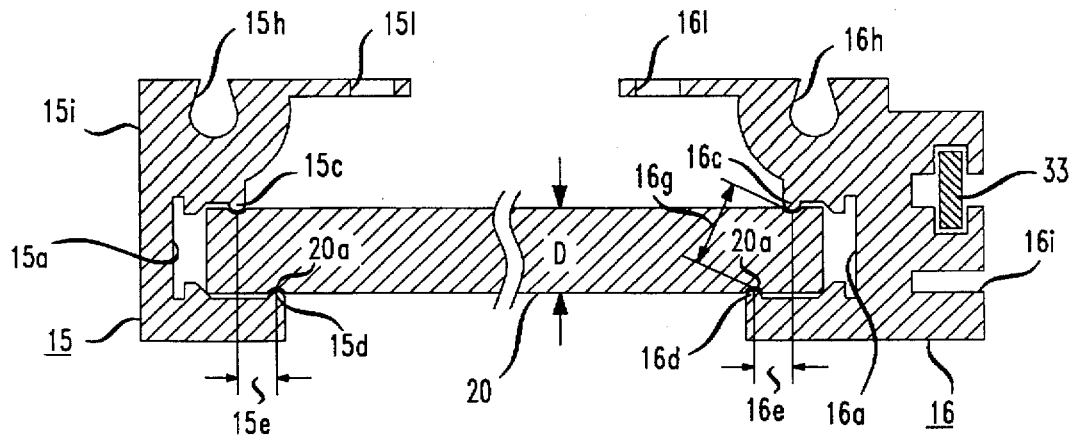

The construction of the transverse profiled rails 15, 16 can be seen from FIGS. 4 and 5. The left-hand part of each of the FIGS. 4 and 5 shows the frontmost transverse profiled rail 15 and the right-hand part the rearmost transverse profiled rail 16. 15a and 16a indicate the longitudinal channels for accommodating the corner connectors 17 mentioned above. The transverse profiled rails 15, 16 have U-shaped grooves 15b, 16b on the inside whose limbs are provided with relevant mutually opposed projections 15c,d, 16c,d. The projections are mutually offset each time by a distance 15e, 16e and have an interspacing 15f, 16f. The connecting line between every two projections 15c,d, 16c,d forms a widened insertion opening 15g, 16g for introducing the honeycomb plate 20.

The honeycomb plate 20 is mounted in accordance with FIGS. 4 and 5 such that first the transverse profiled rails 15, 16 are passed obliquely over two mutually opposed edges of the honeycomb plate 20 with the insertion openings 15g, 16g. Then the transverse profiled rails 15, 16 are rotated until their limb surfaces run parallel to the surfaces of the honeycomb plate 20, as shown in FIG. 5. The projections 15c,d, 16c,d thus bury themselves into the honeycomb plate, forming indentations 20a, and the honeycomb plate is tensioned. In this state, the lateral profiled rails 18, 19 are provided such that the honeycomb plate is gripped and guided by the inner grooves 18b, 19b of the lateral profiled rails. Simultaneously, the corner connectors 17 are introduced into the longitudinal channels 15a, 16a. When these actions have been performed, a stable, EMI-shielded platform results which can be mounted as a self-contained sub-assembly between the side walls 10, 11 of FIG. 1.

The side walls 10, 11 are each provided with inward-directed horizontal bosses 22 in the corner regions of the platforms 12 to 14 to be mounted for supporting the platforms 12 to 14, and with vertical bosses 23 provided in vertical grooves 24 of corresponding shape at the ends of the transverse profiled rails. Screws 12a, 13a, 14a, which can be screwed into relevant longitudinal channels 15h, 16h of the transverse profiled rails 15, 16, serve to connect the platforms 12 to 14 to the side walls 10, 11.

The front and rear transverse profiled rafts of the platforms 12, 13, 14 all have the same profile with the U-shaped groove and the mutually opposed projections in the regions where the honeycomb plate 20 is gripped. In their outer regions, however, the profiles may be of various shapes, as required (see FIG. 12). Thus in FIG. 1, for example, the rear transverse profiled rails of the platforms 12 and 13 have the shape shown in the right-hand portion of FIGS. 4, 5 (profiled rail 16). These profiled rails form longitudinal channels 16i for accommodating fastening screws for a rear printed circuit plate, and longitudinal channels 16k for accommodating a threaded rail 33.

Figure 6:
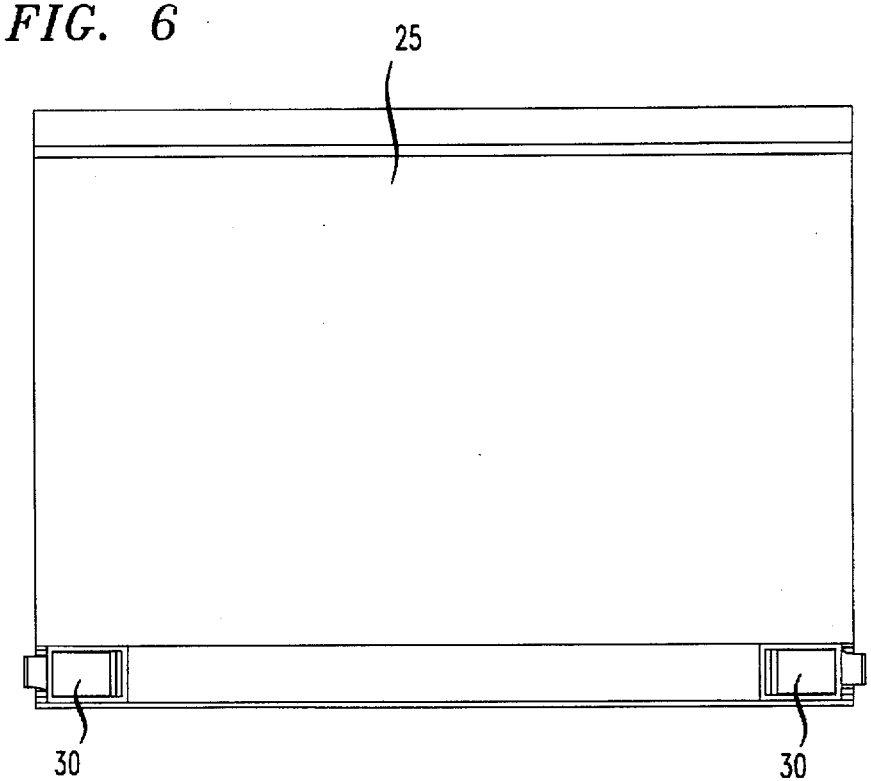
FIGS. 6 and 7 show on an enlarged scale the front and side elevations of a front screen.
Figure 7:
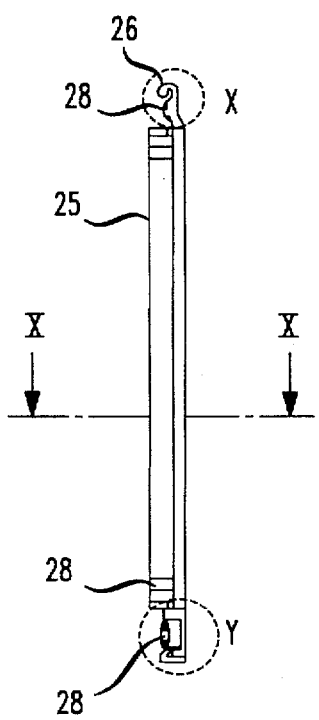
Figure 8:
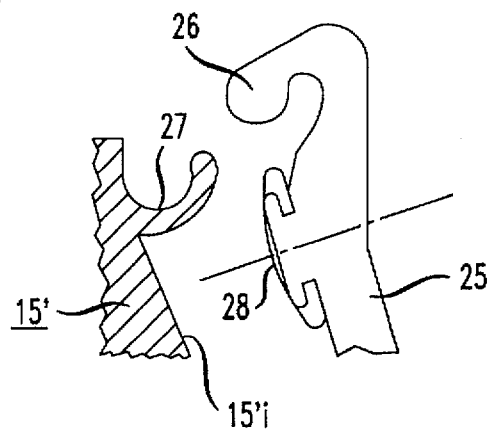
FIGS. 8 and 9 show on an enlarged scale details X, Y from FIG. 7.
Figure 9:
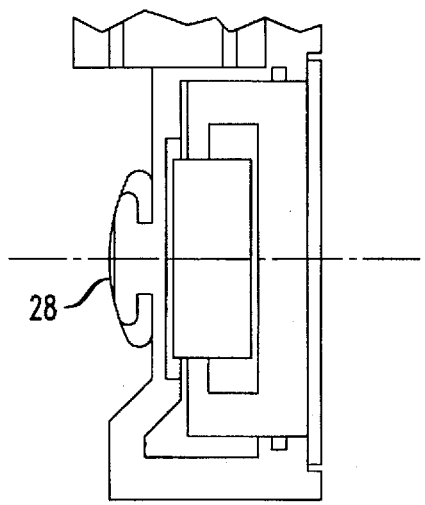
Figure 10:
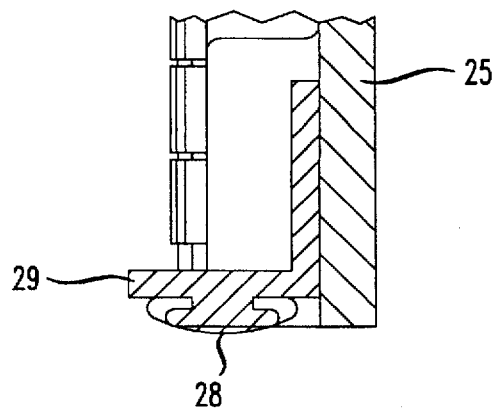
FIG. 10 is a cross-section taken on X—X in FIG. 7.
Figure 11:
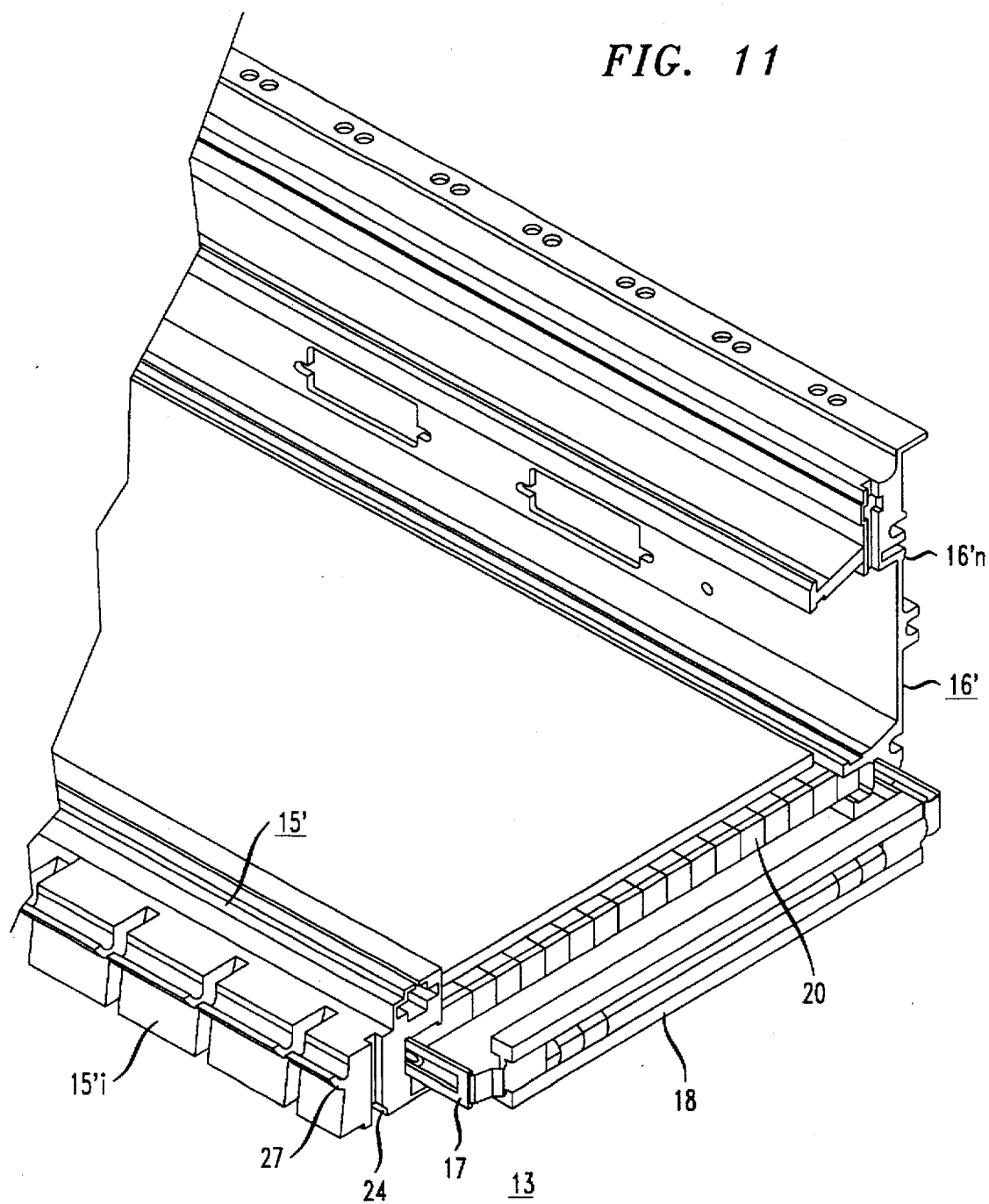
FIG. 11 is a partial view of the central platform.

By contrast, the frontmost transverse profiled rails of the three platforms 12 to 14 are each of different construction. The platforms 12 and 13 form a space which in the present embodiment can be closed with a front screen 25 pictured in FIGS. 6, 7. This front screen 25 is so constructed that it can be suspended with its upper edge from the frontmost transverse profiled rail 15' of the middle platform 13 which is of a corresponding shape. For this purpose, the front screen 25 has at its upper side an S-shaped profile 26 shown in FIGS. 7 and 8 which cooperates with a mating counterprofile with a gutter-shaped groove 27 of the transverse profiled rail 15' (see also FIG. 11). For mounting, the front screen 25 is simply suspended in the gutter 27 and fixes itself upon closing. For EMI-shielding, the front screen 27 has a continuous circumferential metal EMI-shield 28 consisting of single elements, which shield is provided directly against the inside in the two horizontal regions of the front screen 25. The shield 28 here lies in the upper range against the shielding surface 15'i of the transverse profiled rail 15' and in the lower region against the shielding surface 15i of the lower transverse profiled rail 15. Angled flanges 29 are provided at the two vertical side portions of the front screen 25, supporting the shielding 28 at their outsides. In these regions, the shielding 28 lies against the two side walls 10, 11 in the closed state. At the lower end of the front screen 25 there are two locking elements 30 which grip into mating recesses 31 of the side walls 10, 11 upon closing of the front screen. For closing, the front screen is simply suspended and subsequently drops through its own weight, possibly with a slight pressure, into its closed position, whereby the friction of the shields 28 is overcome.

FIG. 2 shows guide rails 32 which are fastened to the frontmost and rearmost transverse profiled rails 15, 16 and which serve to accommodate component assemblies or printed circuit boards (not shown). These assemblies are fitted with electronic components and are inserted into the assembly rack from the front, for example between the two platforms 12, 13.

The lateral profiled rails 18, 19 are of the same construction for all platforms, differing in length only. The middle platform 13 shown in part in FIG. 11 has at its from the transverse profiled rail 15' with the hooked recesses 27 from which the front screen 25 can be suspended, and at its rear a transverse profiled rail 16' of special construction, but again comprising in the lower range the U-shaped groove described above for accommodating the honeycomb plate 20, which groove is of the same construction for all transverse profiled rails. The transverse profiled rail 16' has a longer flange 16'n which is directed upwards and which also provides a possibility for connecting guide rails 32', as can be seen in FIG. 1.

Figure 12:
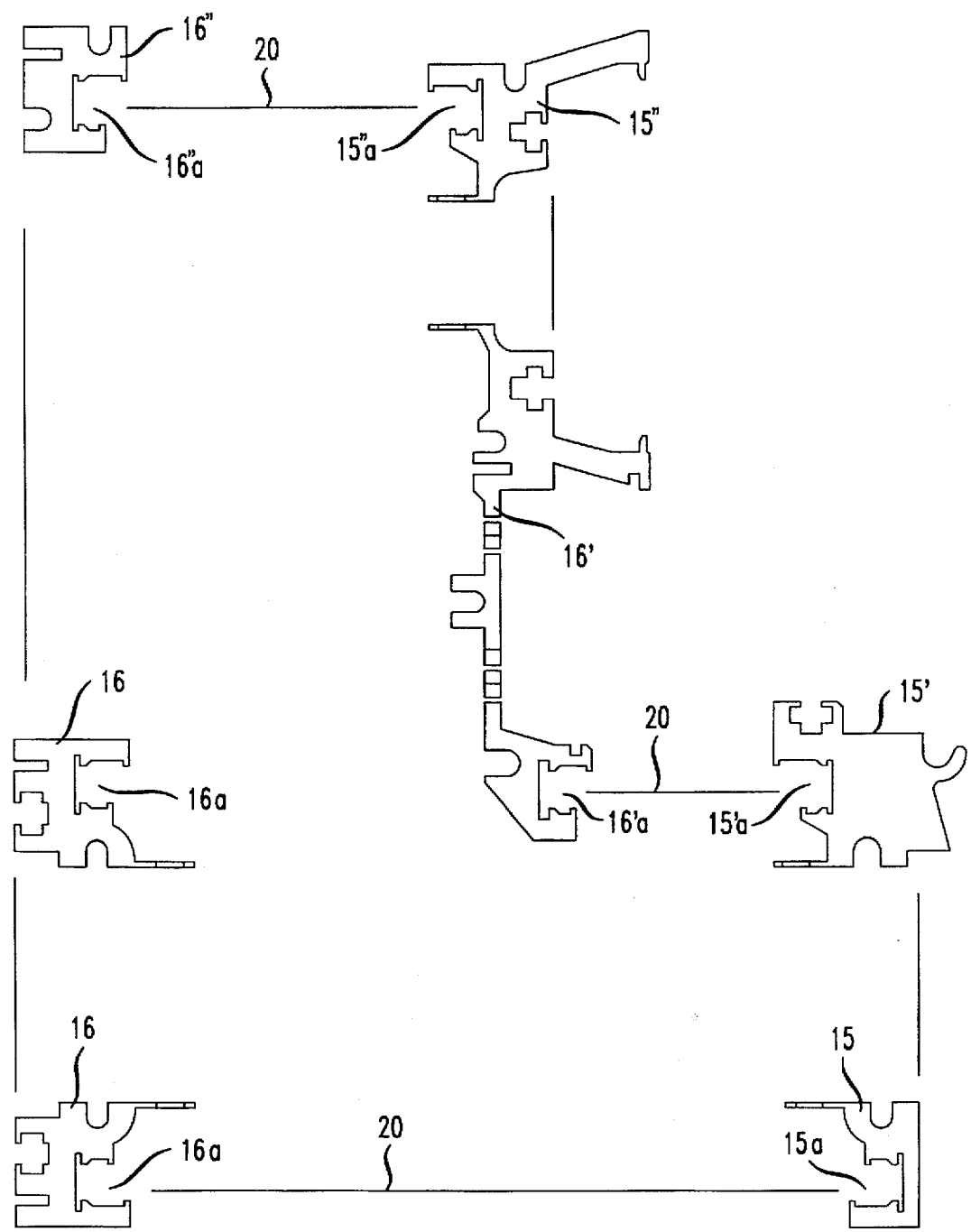
FIG. 12 is a diagrammatic side elevation of the profiles used in FIG. 1.

FIG. 12 is a diagrammatic side elevation of the various profiles used in FIG. 1, clearly showing that all profiles have a groove-shaped region of the same shape where a honeycomb plate 20 is gripped, with the mutually offset projections.

We claim:

1. An assembly rack, comprising:

two side walls (10,11); and at least two subassemblies (12,13) positioned between the side walls (10,11), each subassembly (12,13) having a honeycomb plate (20) connected to a set of transverse profiled rails (15, 16) and a set of lateral profiled rails (18,19), each of the lateral rails (18,19) having spring elements (21) for providing electromagnetic interference shielding when the subassembly is connected to the side walls (10,11), and each subassembly (12,13) being connected to the side walls (10,11) by means for fastening (12a,13a) so that spring elements (21) of each lateral profiled rail contacts at least one of side walls (10,11), the transverse and lateral rails (15,16,18,19) are shaped into frame with an inner circumferential U-shaped groove for retaining the honeycomb plate (20) by means of corner connectors (17), the front and rear transverse profiled rails (15,16) whose limbs are directed towards one another, are each provided on the inside with projections (15c,d, 16c,d) which enter the honeycomb plate (20) and which are arranged so as to be mutually offset, and the lateral profiled rails (18,19) are pressed with grooves (18b, 19b) against the cut-open edges of the honeycomb plate (20).

2. An assembly rack as claimed in claim 1, wherein the corner edges of the transverse profiled rails (15,16) each have at least one groove (24) which extends at right angles to the plane of the subassembly (12,13) for engaging the inward-directed vertical bosses (23) provided in the side walls (10,11).

3. An assembly rack as claimed in claim 1 wherein the transverse profiled rails (15,16) each have a first longitudinal channel (15h,16h) for the accommodation of fastening screws (12a,13a,14a) for the side walls.

4. An assembly rack as claimed in claim 1, wherein one of the limbs of each of the U-shaped transverse profiled rails (15,16) is prolonged and provided with bores (151) for receiving guide rails (32).

5. An assembly rack as claimed in claim 1, wherein the transverse profiled rails (16) each comprise a second and/or third longitudinal channel (16i,16k) which is open towards the front or rear of the assembly rack and which serves to accommodate fastening screws which can be inserted transversely to the longitudinal direction of the channel and/or to accommodate a threaded rail (33).

6. An assembly rack as claimed in claim 1, wherein the interspacing (15f,16f) between the mutually facing, mutually offset projections (15c,d, 16c,d) measured parallel to the limbs of a transverse profiled rail (15,16) is somewhat smaller than the thickness (D) of the honeycomb plate (20) to be gripped by the two limbs.

7. An assembly rack as claimed in claim 1 wherein the groove designed for accommodating the honeycomb plate (20) and formed by the limbs of a transverse profiled rail (15,16) is formed at its base so as to constitute a longitudinal groove channel (15a,16a) for accommodating the corner connectors (17).

8. The assembly rack as claimed in claim 1 wherein the transverse profiled rail for holding a honeycomb plate (20) comprises a) a longitudinal groove (15b) which is U-shaped in cross-section and comprises limbs which run mutually parallel, b) the two limbs each have an inward-directed projection (15c,d), which projections are mutually offset, and c) the interspacing between the two projections (15c,d) —measured as a distance (15f) between the two planes which contain the relevant ends of the projections (15c,d) and extend parallel to the limbs—is somewhat smaller than the thickness (D) of a honeycomb plate (20) to be inserted into the groove (15b).

* * * * *